United States Patent
Anthraper et al.

(10) Patent No.: US 8,203,776 B2
(45) Date of Patent: Jun. 19, 2012

(54) PLANARITY OF PIXEL MIRRORS

(75) Inventors: Rosemary Urmese Anthraper, Richardson, TX (US); Lucius M. Sherwin, Plano, TX (US); Irma Izzeth Annillo, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 647 days.

(21) Appl. No.: 12/324,259

(22) Filed: Nov. 26, 2008

(65) Prior Publication Data

US 2010/0128338 A1    May 27, 2010

(51) Int. Cl.
*G02B 26/08* (2006.01)

(52) U.S. Cl. ....... 359/224.1; 359/900; 438/50; 438/622; 216/17

(58) Field of Classification Search .... 359/224.1–224.2, 359/290–292, 295, 298, 896, 900
See application file for complete search history.

(56) References Cited

U.S. PATENT DOCUMENTS

| | | | |
|---|---|---|---|
| 2005/0000932 A1* | 1/2005 | Gabriel et al. | 216/2 |
| 2006/0094143 A1* | 5/2006 | Haluzak et al. | 438/29 |
| 2007/0042524 A1* | 2/2007 | Kogut et al. | 438/52 |

* cited by examiner

*Primary Examiner* — James Phan
(74) *Attorney, Agent, or Firm* — Warren L. Franz; Wade J. Brady, III; Frederick J. Telecky, Jr.

(57) ABSTRACT

A method of forming an electronic device includes providing a patterned lower metal layer over a substrate and a first sacrificial layer there between. A second sacrificial layer is formed over the metal layer, and a portion thereof is removed. A third sacrificial layer is formed over the second sacrificial layer, and an upper metal layer is formed over the third sacrificial layer. A portion of the upper metal layer is removed, and the first, second and third sacrificial layers are removed.

25 Claims, 8 Drawing Sheets ially planar pixel mirror with a side length less than about 1 mm. The embodiments herein are beneficial for devices in which a pixel mirror is a micromirror. The embodiments may be discussed with nonlimiting reference to micromirrors, though the disclosure is not limited to cases in which a pixel mirror is also a micromirror. In one type of DMD, each micromirror is attached to a torsion spring. A torque may be applied to the micromirror by, e.g., an electric field, which causes the micromirror to deflect from a rest position. When the torque is removed, the restoring force of the torsion spring returns the micromirror to its rest position.

PLANARITY OF PIXEL MIRRORS

TECHNICAL FIELD

The disclosure is directed, in general, to forming an electronic device and, more specifically, to improved topographic uniformity of a metal layer.

BACKGROUND

In some electronic devices, variation of the surface height of a metal layer is undesirable. One class of such devices includes mirror elements. When the height of a particular mirror surface varies across the mirror, light reflected from the surface may be scattered. When an array of mirrors is used to create projected image, the scattering may result in reduced image quality due to, e.g., reduced contrast.

SUMMARY

In one embodiment, a method of forming an electronic device includes providing a patterned lower metal layer over a substrate and a first sacrificial layer therebetween. A second sacrificial layer is formed over the lower metal layer, and a portion thereof is removed. A third sacrificial layer is formed over the second sacrificial layer, and an upper metal layer is formed over the third sacrificial layer. A portion of the upper metal layer is removed, and the first, second and third sacrificial layers are removed.

In another embodiment, an electronic device includes a reconfigurable pixel mirror assembly over a substrate. The pixel mirror assembly includes a support attached to the substrate. A freestanding pixel mirror is attached to the support, with the pixel mirror being configured to change a reflection angle of light incident on a surface thereof. An upper surface of the pixel mirror has a nonplanarity no greater than about 50 nm.

Another embodiment provides a method of manufacturing a digital pixel mirror device. A first sacrificial layer is formed over a substrate. A lower metal layer is formed over the first sacrificial layer. A portion of the lower metal layer is removed to form a plurality of hinges. A second sacrificial layer is formed over the hinges, and a portion of the second sacrificial layer is removed to expose an upper surface of the hinges, wherein a remaining portion remains over the first sacrificial layer between the hinges. A third sacrificial layer is formed over the second sacrificial layer, and an upper metal layer is formed thereover. A portion of the upper metal layer is removed to form an array of pixel mirrors, where each pixel mirror is associated with a corresponding hinge. The first, second and third sacrificial layers are removed.

BRIEF DESCRIPTION OF THE DRAWINGS

For a more complete understanding of the disclosure, reference is now made to the following descriptions taken in conjunction with the accompanying drawings, in which.

DETAILED DESCRIPTION

A digital micromirror device (DMD) may be used to form images from one or more light beams. Each micromirror in an array of micromirrors may be controlled to produce a pixel of an image. As used herein, a micromirror is a generally planar pixel mirror with a side length less than about 1 mm. The embodiments herein are beneficial for devices in which a pixel mirror is a micromirror. The embodiments may be discussed with nonlimiting reference to micromirrors, though the disclosure is not limited to cases in which a pixel mirror is also a micromirror. In one type of DMD, each micromirror is attached to a torsion spring. A torque may be applied to the micromirror by, e.g., an electric field, which causes the micromirror to deflect from a rest position. When the torque is removed, the restoring force of the torsion spring returns the micromirror to its rest position.

The quality of the image may be limited by several factors. In particular, the deviation from planarity of a micromirror may cause light reflected from the surface of the micromirror to scatter or to spread. The scattering or spreading may cause light to leak from the image pixel corresponding to that micromirror to other pixels in the image, reducing contrast and possibly causing other undesirable image artifacts. Herein, contrast is the ratio of the average luminescence of white pixels to the average luminescence of black pixels produced by the DMD. The contrast of a typical image formed by a DMD is about 1500:1.

The present disclosure provides a method of forming a DMD with improved planarity of a mirror metal level, resulting in improved reflecting characteristics of micromirrors formed therefrom. Thus, in general image artifacts may be reduced in an image formed from the improved DMD, and in particular, image contrast may be increased.

Figure 1A:
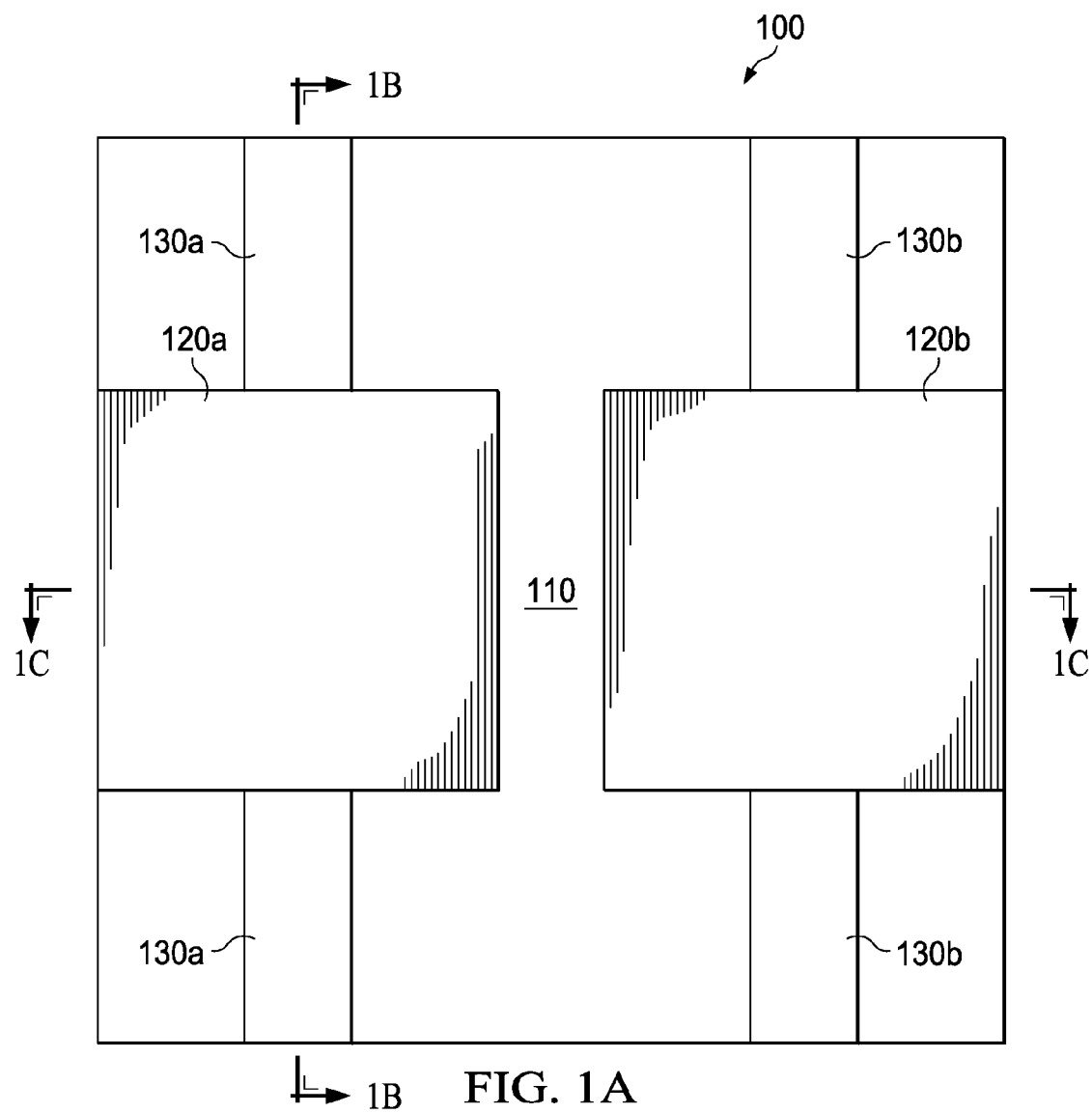
FIGS. 1A-1C, 2A and 2B illustrate structural aspects of pixel mirrors.
Figure 1B:
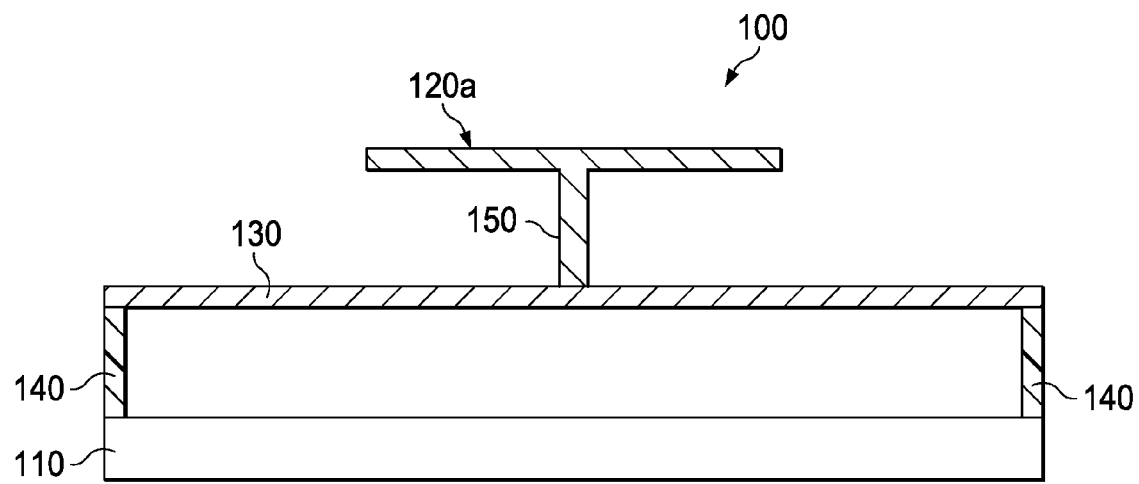
Figure 1C:
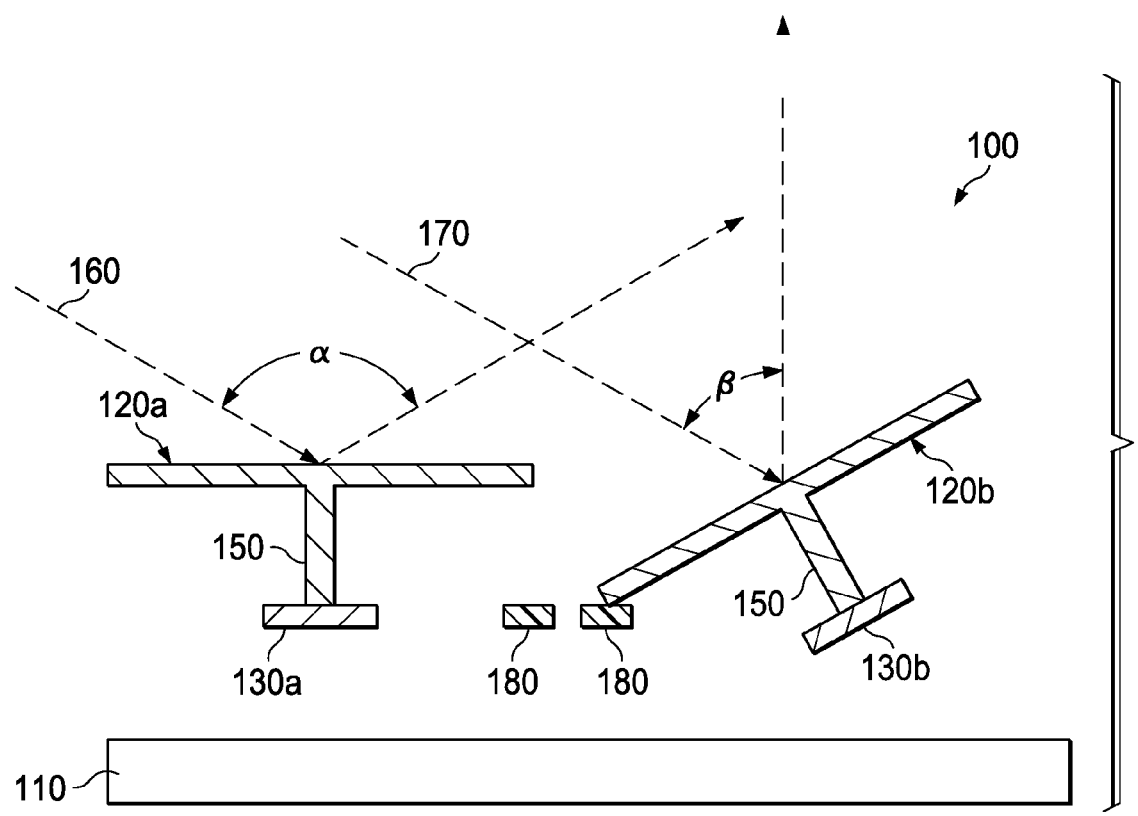

FIGS. 1A-1C illustrate a portion of a micromirror array 100 according to the disclosure. FIG. 1A shows a plan view including a substrate 110 with two pixel mirrors 120a, 120b formed thereover. Hinges 130a, 130b underlie and support the pixel mirrors 120a, 120b. The micromirror array 100 is configured to selectively provide a torque on each micromirror 120a, 120b. The pixel mirror 120b is illustrated with a torque applied. The torque displaces the micromirror 120b from its rest position, twisting the hinge 130b. The hinge 130b provides a restoring force, so that the micromirror 120b returns to the rest position when the torque is removed.

FIG. 1B illustrates a sectional view through the pixel mirror 120a. Supports 140 are located between the substrate 110 and the hinge 130. A post 150 is located between the pixel mirror 120a and the hinge 130. The pixel mirror 120a, post 150 and hinge 130 are referred to collectively as a mirror assembly. FIG. 1C illustrates a sectional view through the pixel mirrors 120a, 120b. The pixel mirror 120a is freestanding in the sense that, with the exception of the post 150, the pixel mirror 120a is mechanically supported by itself. During operation, parallel light rays 160, 170 may be directed to the pixel mirrors 120a, 120b. The ray 160 reflects from an upper surface of the pixel mirror 120a in a first direction with an angle $\alpha$, while the light ray 170 reflects from the upper surface of the pixel mirror 120b in a different second direction with an angle $\beta$. By selectively actuating the pixel mirrors 120a, 120b, pixels of an image may be selectively formed by the reflected rays. Typically, the micromirror array 100 includes several thousand pixel mirrors to form such an image. The micromirror array 100 is reconfigurable in the sense that a subset of pixel mirrors 120 may be configured on a dynamic basis to provide an image that varies over time.

Figure 2A:
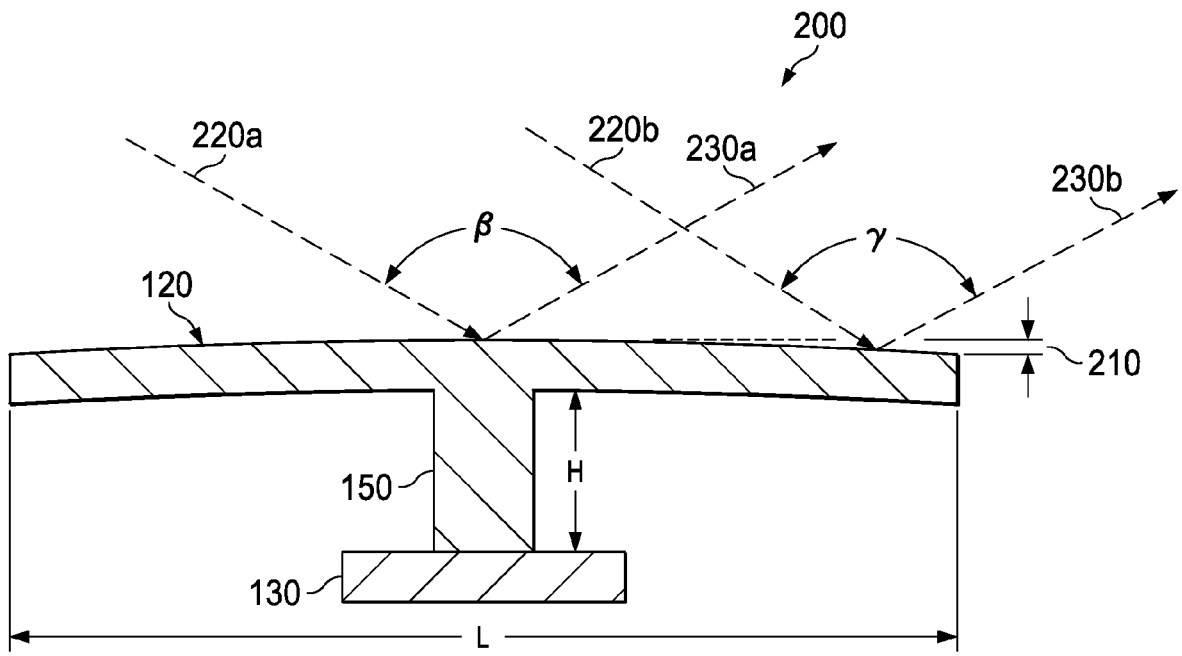

FIG. 2A illustrates a single mirror assembly 200. The mirror assembly 200 is characterized by a length L of the pixel mirror 120, and a height H of the post 150 that is also the distance between the hinge 130 and the pixel mirror 120. As described below, aspects of a process of forming the pixel mirror 110 may result in a degree of nonplanarity of the surface thereof. As used herein nonplanarity of the pixel mirror 120 may be quantified by a height difference 210 between the surface of the pixel mirror 120 at about the center and at about the edge thereof.

In some cases, it may be convenient to characterize nonplanarity by, e.g., linear RMS flatness measurements by, e.g., atomic force microscopy. Two parallel rays 220a, 220b are illustrated reflecting from the center and edge, respectively, of the pixel mirror 110. A ray 230a is reflected by the center of the pixel mirror 110 with the angle β, and a ray 230b is reflected by the edge with an angle γ. Generally, β and γ are different values. The magnitude of the difference depends in general on the magnitude of the height difference 210.

Figure 2B:
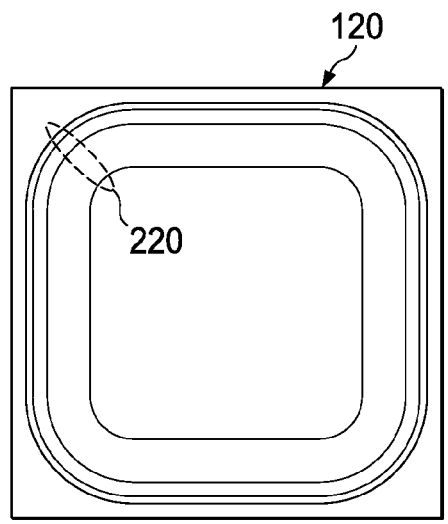

Nonplanarity of the pixel mirror 120 may also be characterized two-dimensionally. FIG. 2B illustrates a plan view of the pixel mirror 120. In a non-limiting example, contour lines 220 characterize the planarity of the pixel mirror 120 surface. The two dimensional nonplanarity may be characterized in several ways, e.g., RMS flatness, AFM contour, or interferometry.

Regardless of the characterization method, physically a conventional pixel mirror deviates from perfect planarity by at least 50 nm, meaning the mirror surface in at least one location is displaced vertically by at least 50 nm with respect to a mathematical plane at a mean surface height. Typically, the edges of the mirror are at lower height than the center of the mirror, as illustrated in FIG. 2A, e.g.

When the nonplanarity is too great, the difference between β and γ may be large enough that the quality of an image formed by an array of mirror pixels is diminished. For example, because the rays 230a and 230b are not parallel, light reflected by the pixel assembly 200 may leak from an image pixel controlled by the pixel assembly 200 to another image pixel location. Such light leakage may decrease the contrast of the resulting image, e.g. However, when the pixel mirror 120 is formed according the disclosure, the difference between β and γ may be limited to less than about 0.5 degrees. For example, in an illustrative embodiment, when the length L is about 17 μm, and the height 210 is about 50 nm, γ−β is about 0.3 degrees. In another aspect, the upper surface of the pixel mirror 120 has a nonplanarity no greater than about 50 nm. In some embodiments, the contrast is thereby increased by at least about 5% over a conventional pixel mirror.

In another aspect, the brightness of a display pixel corresponding to a particular pixel mirror 120 may be limited by the light leakage. The brightness may be expressed as a ratio of the light incident to the pixel mirror 120, integrated over the surface of the pixel mirror 120, to the light projected at the corresponding image pixel, integrated over the area of the image pixel. Ideally, 100% of the light incident to the pixel mirror 120 is reflected to the display pixel. Various imperfections generally limit the ratio to less than 100%. But by reducing the difference between β and γ to less than about 0.5 degrees, the brightness ratio may be increased by greater than about 5%.

In another aspect, if the nonplanarity of the pixel mirror 120 is too great, the angle at which the pixel mirror 120 stops when actuated may be outside an allowable tolerance. The mirror assembly 200 may include spring tips 180 that act to stop the displacement of the pixel mirror 120. When the height difference 210 is too great, the angle β may deviate sufficiently from a design value that a portion of the light reflected by the pixel mirror 120 may fall outside an intended image pixel of a projected display.

The disclosure reflects the recognition that the planarity may be significantly improved by novel process steps that may significantly reduce the height difference 210 relative to conventionally formed mirror assemblies. The improved planarity advantageously increases the quality of an image produced by a mirror array formed as described herein.

Figure 3A:
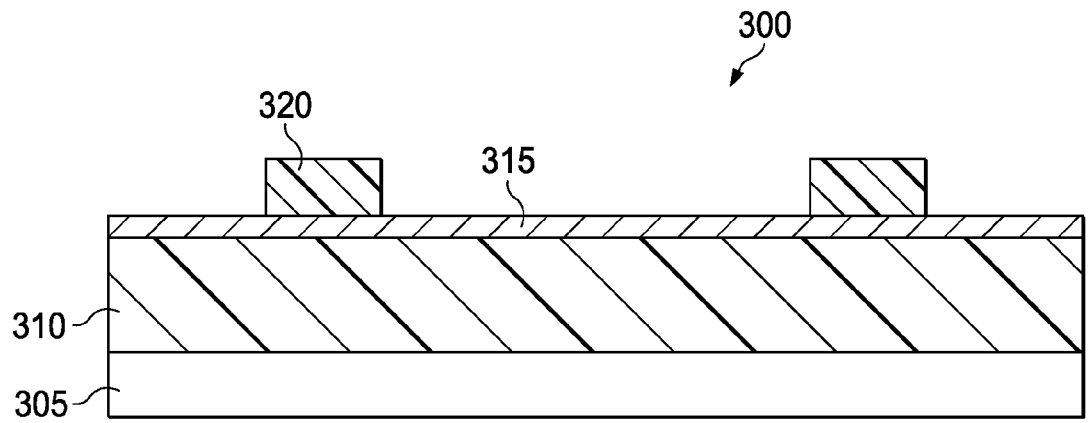
FIGS. 3A-3K illustrate various steps used in forming a pixel mirror array of the disclosure.

Accordingly, FIGS. 3A through 3K illustrate steps in the formation of a DMD 300 with improved mirror planarity. Turning first to FIG. 3A, a substrate 305 is provided with a first sacrificial layer 310 formed thereover. As used herein, "provided" means that an element, e.g., a device, subassembly, or partially completed device, may be formed in a local manufacturing environment, or obtained from any other source. The sacrificial layer 310 is a conventional material such as a photoresist or an ARC (anti-reflective coating) layer. Such materials are commonly plumbed to coaters in semiconductor fabrication facilities. The sacrificial layer 310 may be stabilized by, e.g., an ultraviolet (UV) cure. A process such as, e.g., an isotropic oxygen ash may be used to remove the sacrificial layer 310 in a later process step. A hinge metal layer 315 is present over the first sacrificial layer 310, and a resist level 320 has been formed thereover. The resist level 320 is formed in a desired pattern of torsion hinges, e.g.

Figure 3B:
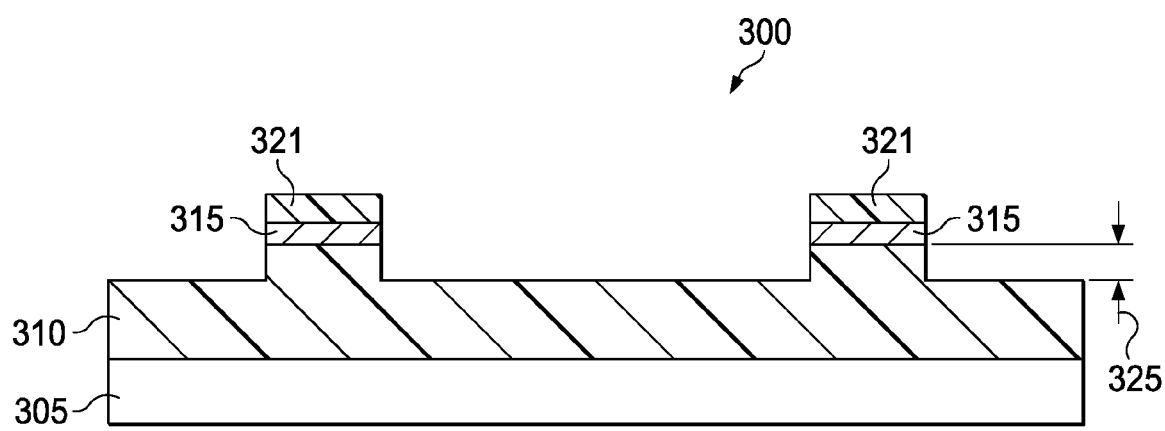

FIG. 3B illustrates the DMD 300 after a conventional etch process has removed a portion of the hinge metal layer 315, the first sacrificial layer 310 and the resist level 320. The removing has resulted in noncontiguous portions of the hinge metal layer 315, and has removed a portion of the first sacrificial layer 310. Remaining portions 321 of the resist level 320 are present over the hinge metal layer 315. A step height 325 results from removing the first sacrificial layer 310 portion. The step height 325 is determined in part by the thickness of the hinge metal layer 315, the selectivity of the etch process used, and the amount of overetch. While careful process design may minimize the step height 325, generally it cannot be eliminated.

Figure 3C:
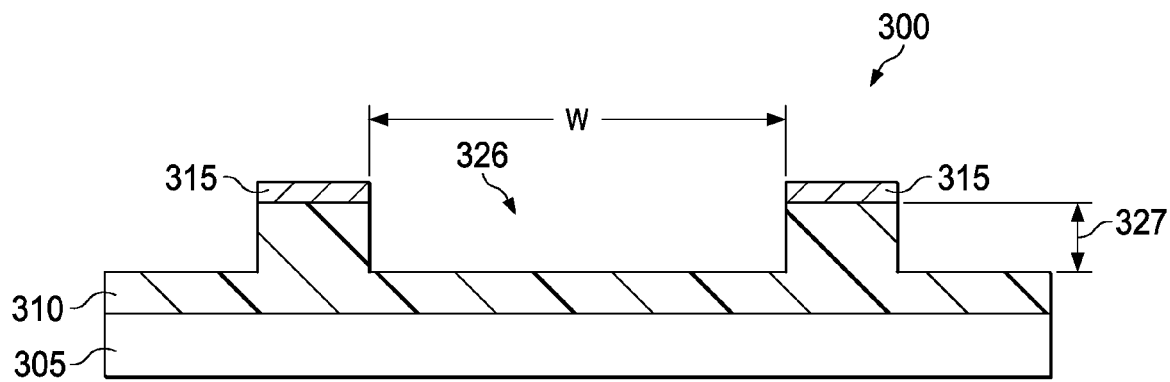

FIG. 3C illustrates the DMD 300 after a conventional post-etch clean performed to remove the remaining portions 321. The clean step typically removes an additional portion of the first sacrificial layer 310. The removing results in a gap 326 with a step height 327 and a width W. The clean step typically uses a plasma etch or ash process. To ensure complete removal of the portions 321, an overetch is typically employed. Thus, the step height 327 is generally greater than the step height 325.

Figure 4:
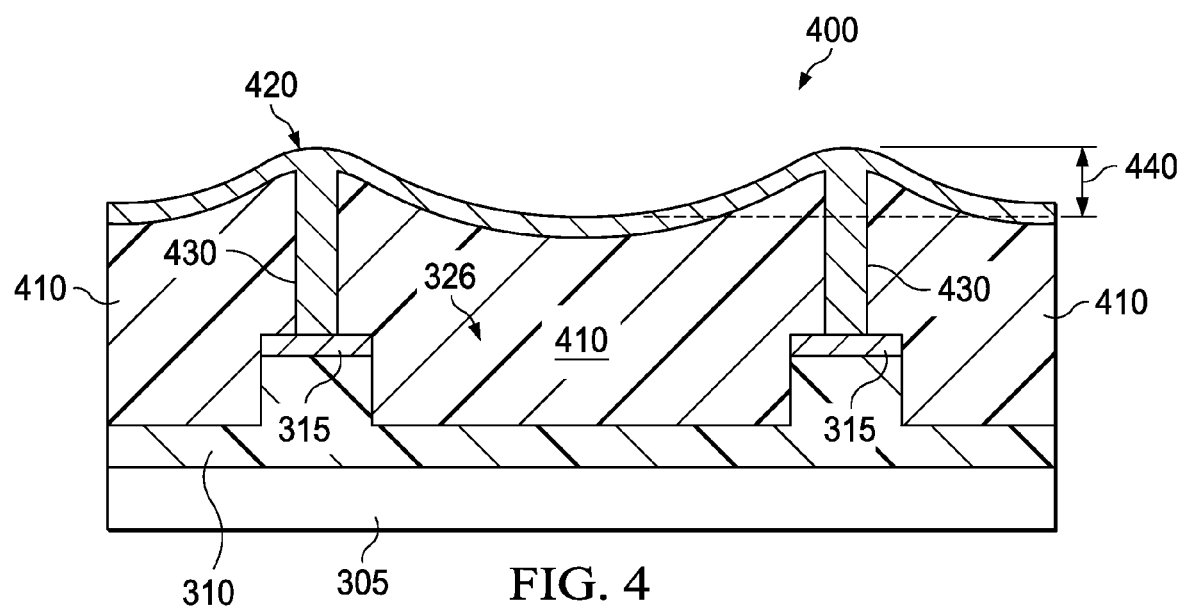
FIG. 4 illustrates a prior art partially completed pixel mirror.

In conventional processing, the step height 327 is partially transferred to the pixel mirror 120. Turning briefly to FIG. 4, illustrated is a sectional view of a partially completed prior art DMD 400. Elements common to the DMD 100 and the DMD 400 are shown with common reference numerals. A second sacrificial layer 410 has been formed over the substrate 305. A mirror metal level 420 has been formed over the second sacrificial layer 410. Openings have been formed in the second sacrificial layer 410, and metal fills the openings to form posts 430. The presence of the gap 326 has resulted in topography of the sacrificial layer 410. (The illustrated topography is exaggerated for illustration purposes.) This topography is transmitted to the metal level 420 with a height 440. Thus, the greater step height 327 generally results in greater nonplanarity of the pixel mirror 120. The resulting topography of the metal level 420 will remain in individual micromirrors later formed from the mirror metal level 420, resulting in the aforementioned nonplanarity and image artifacts.

Figure 3D:
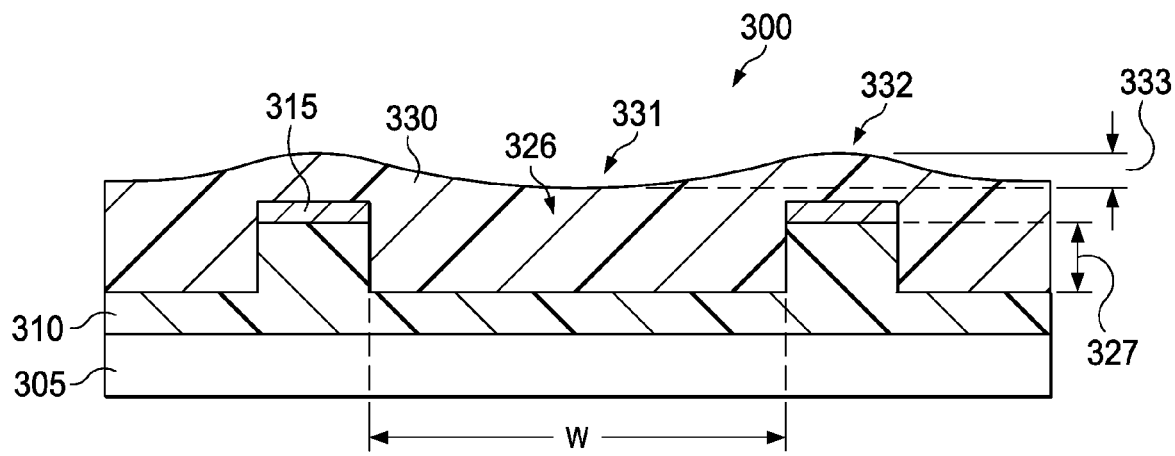

Turning to FIG. 3D, a method is described that reduces the nonplanarity of the pixel mirrors 120. A second sacrificial layer 330 has been formed over the first sacrificial layer 310, including over the patterned hinge metal layer 315. The thickness of the second sacrificial layer 330 is chosen to fill the gap 326 while reducing topography of the partially completed device 300. In some embodiments, the thickness of the second sacrificial layer 330 is less than the height H of the post 150. The second sacrificial layer 330 is formed from a liquid solution of a coating compound applied on, e.g., a spin coating tool. The coating solution may be, e.g., a photoresist or ARC. The step height 327 has resulted in a valley 331 and a peak 332 with a height difference 333. The height difference 333 is a function of the step height 327, the width W and the ability of the liquid solution to fill gaps. The filling ability is generally related to the viscosity and surface tension of the coating solution, and the wetting of the underlying surface by the coating solution. In some embodiments, the height difference 333 is less than about 10% of the step height 327. In some cases, the height difference 333 is no greater than about 50 nm, e.g., equal to about 50 nm or less. In some cases, a 50 nm height difference 333 corresponds to less than about 5% of the step height 327. Thus, the addition of the second sacrificial layer 330 may reduce the step height 327 by at least about 90%.

A specific formulation of a coating solution typically reflects a balance by the manufacturer between coating uniformity and the ability to fill gaps. Outside of a process space determined to provide a desired balance, the coating solution will not generally provide a beneficial result over all gaps.

Figure 3E:
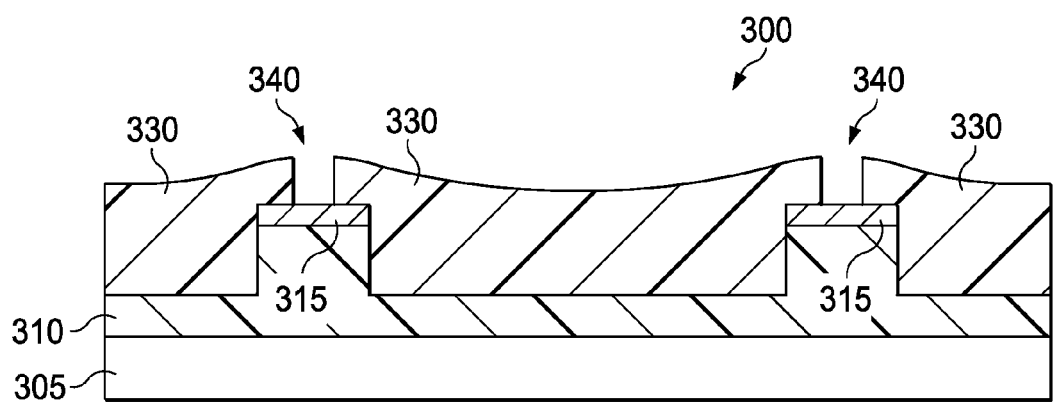

Turning to FIG. 3E, in an optional step openings 340 are formed in the second sacrificial layer 330 by, e.g., exposure to UV light using a mirror-post mask pattern and conventionally developing the resist. The develop process is configured to remove essentially all of that portion of the second sacrificial layer 330 within the opening 340. The purpose of this opening step is discussed below. After forming the openings 340, a conventional UV bake may be performed.

Figure 3F:
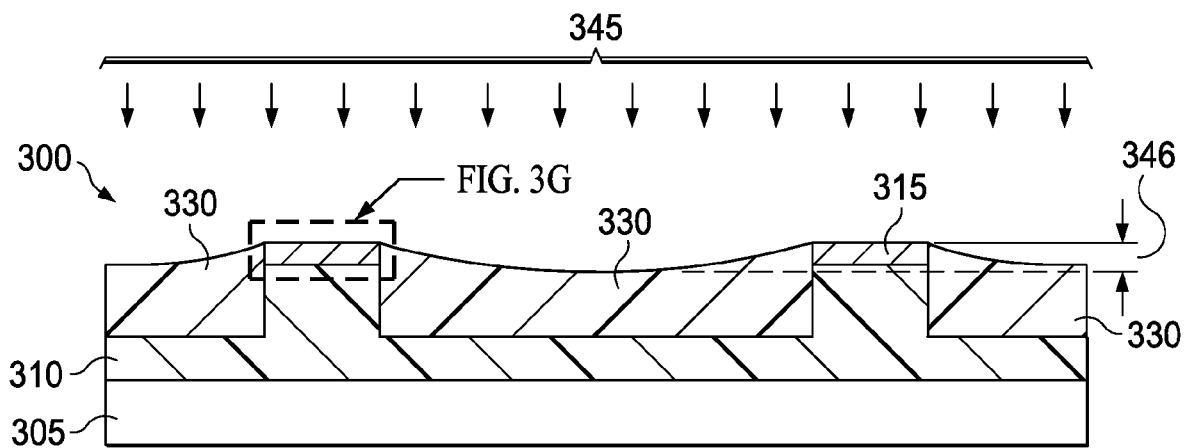

FIG. 3F illustrates the device 300 after a portion of the second sacrificial layer 330 is removed by, e.g., a blanket etchback process 345 resulting in a height difference 346. The etchback process 345 is configured to stop after a signal is detected indicating that the second sacrificial layer 330 has been cleared from the hinge metal layer 315. The etchback process 345 may be performed in an asher or an etch tool, e.g. However, in some cases an etch tool is preferred due to the greater process uniformity generally provided by the etch tool. For example, a LAM 4520 etcher may be used. Such an etcher may be configured to have an etch rate nonuniformity of about 1% or less across a 200 mm wafer. An optional clean may be performed after the etchback process 345. A non-limiting example of a suitable clean process is a 15 second develop clean followed by a UV-cure to stabilize the second sacrificial layer 330.

In some cases, the etchback process 345 is configured to stop immediately after clearing the second sacrificial layer 330 from the hinge metal layer 315. Any further etch may result in a larger height difference 346. In some cases, a larger height difference 346 may contribute to deformities in the pixel mirror 120 formed at a later step.

In some device designs, the area covered by the hinge metal layer 315 is 10% or less, and may be as little as 1% of the substrate 305 area. In such cases, an optical signature in the plasma, such as a CO emission line, e.g., is generally too weak to serve as an end point. Other optical signals, such as, e.g., a brightening of the plasma when the hinge metal layer 315 is exposed, may be used, though in some cases such signals are also too weak to reliably stop the etch.

However, the disclosure includes the recognition that a signal associated with a change of the plasma impedance may be used to stop on the hinge metal layer 315. For example, a change of the plasma impedance may be large enough that it may be reliably detected. Such a change may be detected directly. Those skilled in the pertinent art are familiar with methods and devices used to characterize plasma impedance. A change of impedance may also be detected indirectly. For example, a tuning network of the plasma tool may be used to determine that the plasma impedance has changed. Such networks are typically matched by physically moving a matching network to match a plasma impedance to minimize reflected power. A signal may be taken from, e.g., a servo unit controller that positions the matching network, or a position sensor. In practice, such an approach has been found to result in a robust signal indicating that second sacrificial layer 330 has cleared from the hinge metal layer 315. The small size of mirrors with lengths L of about 17 μm may exclude the use of other indirect methods of detecting a change of impedance familiar to those skilled in the pertinent art, such as detecting plasma optical changes correlated with a change in impedance.

In some cases, the etchback process 345 may be terminated immediately upon detecting an endpoint. In such cases, addition to the height difference 333 is minimal, and the height difference 346 is about equal to the height difference 333. When a planarizing material is used to form the sacrificial layer 330, a step height 346 of no greater than about 50 nm may be achieved. Such may be desirable when a substantial planar surface is desired upon which to form a mirror metal layer in a subsequent step. In other cases, a greater step height may be desired, as described below. In these cases, the etchback process 345 may be continued after the endpoint detection to result in a desired height difference 346.

Known conventional processes using a sacrificial planarizing layer, e.g., the sacrificial layer 330, remove the entire layer in a single removal process. The etchback process 345 differs from these conventional processes in that a portion of the sacrificial layer 330 is removed, but a portion remains to be used to mechanically support later-formed structures. Only after the later-formed structures are complete and supported by other means is the remaining sacrificial layer removed.

Figure 3G:
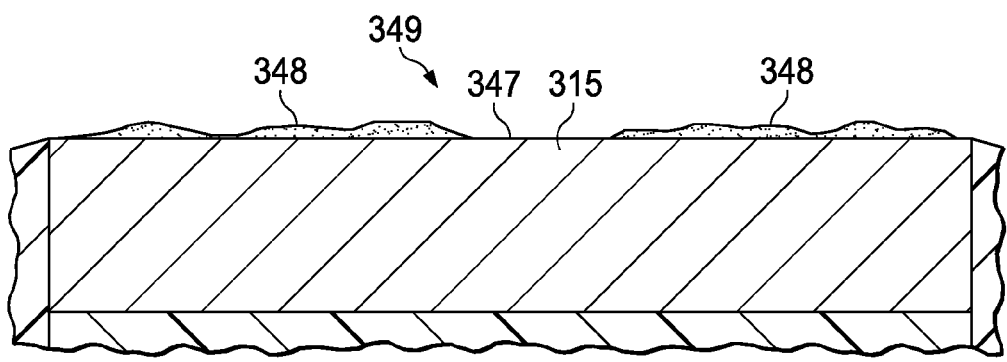

FIG. 3G illustrates the hinge metal layer 315, enlarged for magnification purposes, after the etchback process 345. The hinge metal layer 315 has an upper surface 347. In some cases a residue 348 of the second sacrificial layer 330 remains on the upper surface 347, even when the optional clean is performed. A central region 349 of the upper surface 347 remains clear of the residue 348. A portion of the hinge metal layer 315 outside the region 349 is referred to herein as the perimeter region. Because the portion of the second sacrificial layer 330 overlying the region 349 was removed previously, the region 349 is substantially clear of any residue.

Figure 3H:
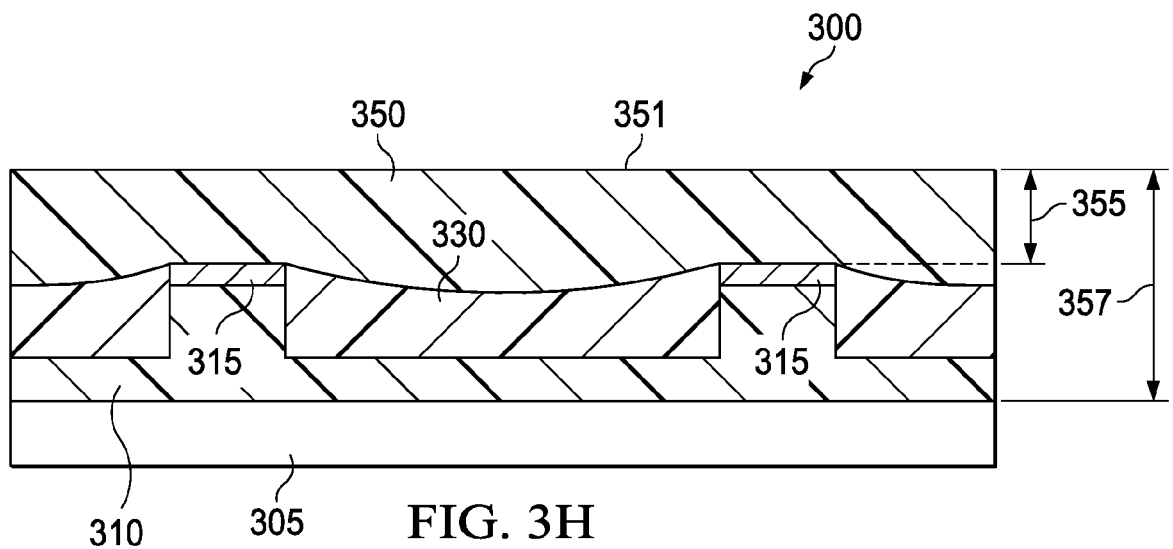

FIG. 3H illustrates the device 300 after formation of a third sacrificial layer 350 having a surface 351 over the second sacrificial layer 330. The third sacrificial layer 350 may again be a photoresist or ARC, and is applied by, e.g., a spin-on process determined to result in a substantially uniform thickness 355 above the hinge metal layer 315. While such a process is generally different for different photoresist compositions, a process with the desired uniformity is within the ability of those skilled in the pertinent arts. Again, a conventional UV bake may be used after forming the third sacrificial layer 350.

In some embodiments, the thickness 355 is a value predetermined to provide the spacing H (referring to FIG. 2A) between the hinge metal layer 315 and the later formed mirror level. When the hinge metal layer 315 is formed with this predetermined value, a later etchback process may be unnecessary. However, when a substantially planar surface 351 is desired, a thickness 355 greater than the predetermined value may be necessary. In such cases, a uniform etchback process may be used to reduce the thickness 355. In this case, nonuniformity of the etchback process may produce nonplanarity of the surface 351. Thus, it is generally preferred to form the third sacrificial layer 350 with the predetermined value. Under these conditions, it has been found that when the height difference 346 is no greater than about 50 nm, any deviation from planarity of the surface 351 is generally below the noise threshold of the measurement system.

In some embodiments, Shipley S660 photoresist is used to form the third sacrificial layer 350 with a thickness of about 1.5 µm. Those skilled in the pertinent art are capable of selecting an alternative material or thickness.

Figure 3I:
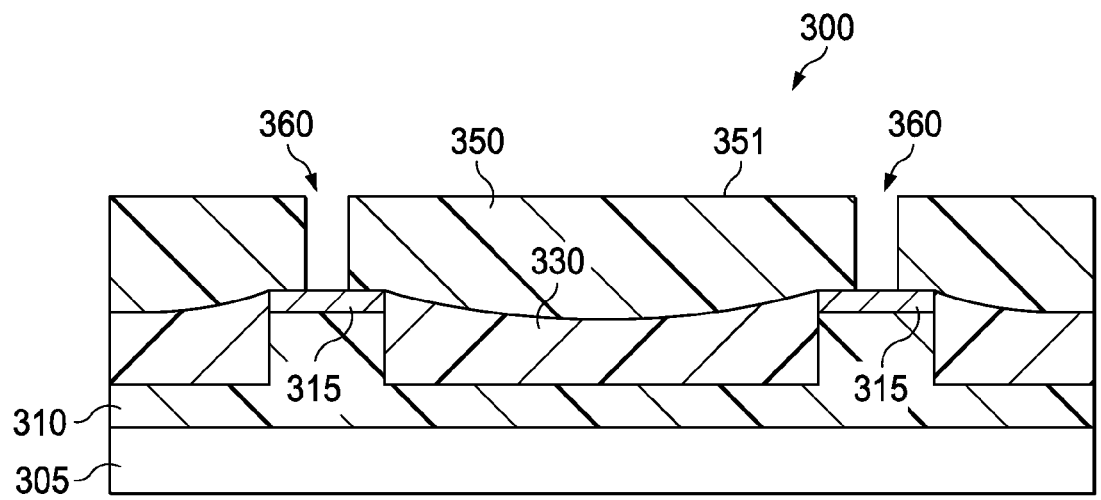

In FIG. 3I, openings 360 are formed in the third sacrificial layer 350 by, e.g., exposure and development using the same mask used to form the openings 340. The mask is positioned such that the openings 360 are located substantially in the same position as the openings 340.

When the second sacrificial layer 330 is etched back (see FIG. 3F), the lack of an overetch in some embodiments creates a nontrivial possibility that some of the second sacrificial layer 330 remains on portions of the hinge metal level 315. In particular, without first creating the openings 340, material may remain in the region 349 (FIG. 3G). When a UV bake is used, remaining portions are generally not removed by wet cleans or resist develop processes. In this case, some cured material may remain in the region 349. Thus, without more, when the openings 360 are formed, some residue of the second sacrificial layer 330 may be present at the bottom of the opening. When present, such material may lead to lower yield or reliability of the completed mirror assembly.

The disclosure includes the recognition that the aforementioned risk may be substantially reduced or virtually eliminated by forming the openings 340 before the second sacrificial layer 330 is UV baked. With the exception of small misalignment of the first and second exposures using the mirror-post mask, essentially none of the second sacrificial layer 330 remains over the hinge metal level 315 within the openings 360. Thus, the objective, in some cases, of providing minimal overetch in the etchback process 345 may be accomplished with little or no impact on device yield or reliability.

Figure 3J:
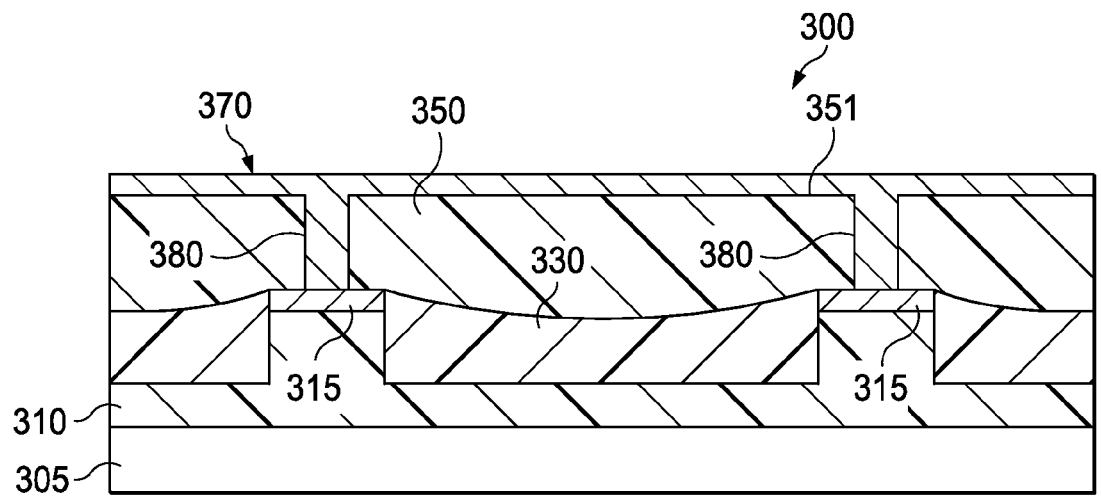

Turning to FIG. 3J, illustrated is the partially formed DMD 300 after formation of a mirror metal layer 370. The mirror metal layer 370 fills the openings 340 to form mirror posts 380. Because the surface 351 of the sacrificial layer 350 may be made substantially planar, nonplanarity of the resulting pixel mirrors may be substantially reduced relative to conventional formation. More specifically, the pixel mirror 120 may be formed with a height difference 210 no greater than about 50 nm. When the mirror length L is about 17 µm, the resulting difference γ–β is expected to be no greater than about 0.5 degrees. This is expected to increase the contrast and brightness of an image formed by an array of the pixel mirrors 120 by at least about 6%.

Figure 3K:
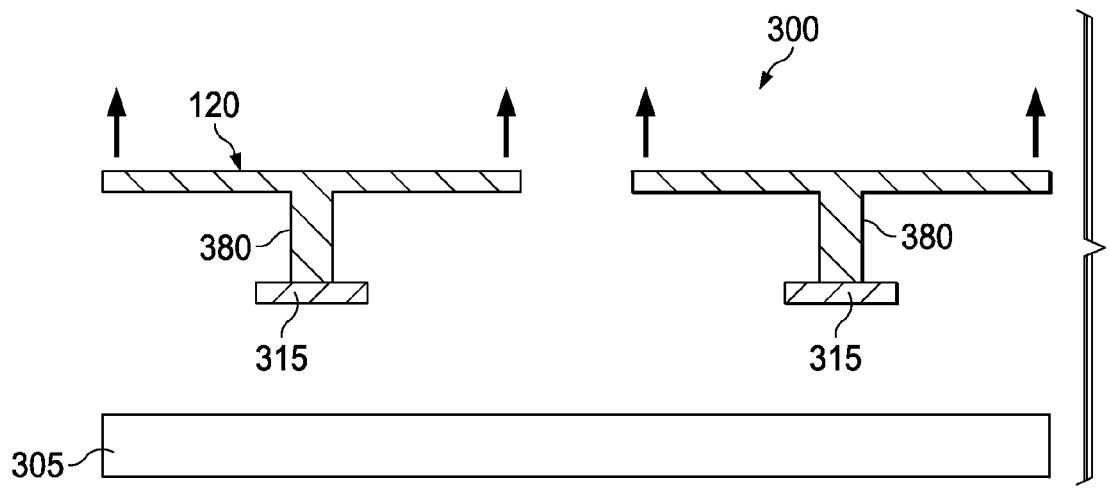

FIG. 3K illustrates the device 300 after individual micromirrors 120 have been formed from the mirror metal layer 370 by, e.g., conventional pattern and etch. The sacrificial layers 310, 330, 350 have been removed by, e.g., an isotropic oxygen ash. The illustrated embodiment shows displacement of the edges of the pixel mirrors 120 in the upward direction, introducing nonplanarity to the mirror surface. Such "cupping" may be caused when, e.g., the surface 351 is substantially planar, and tensile stress in the mirror metal layer 370 deforms the pixel mirror 120. In some cases, the displacement may be large enough to reduce the quality of an image formed by an array of cupped micromirrors 120.

In an embodiment, the tensile stress is compensated by increasing the height difference 346. The height difference 346 may be increased, e.g., by continuing the etchback process 345 for some period after detecting a change of plasma impedance consistent with clearing the hinge metal 315. The height difference 346 may range, e.g., between a minimum of about 50 nm, as previously discussed, and a distance between the hinge metal 315 and the substrate 305. In an embodiment, the etchback process 345 is configured to produce a height difference 346 that compensates the stress of the mirror metal layer 370 to increase planarity of the micromirror 120 after removing the sacrificial layers 310, 330, 350. In some cases, the stress of the mirror metal layer 370 may be compressive, and would cause the micromirror 120 to bow down if formed on a perfectly planar surface 351. In these cases, the height difference 346 may be reduced to the extent possible, e.g., no greater than about 50 nm.

By selecting the height difference 346 appropriately, a compressive or tensile stress in the mirror metal layer 370 may be compensated such that nonplanarity of the micromirror 120 is almost arbitrarily small. For instance, the nonplanarity of the upper surface of the micromirror 120 may be reduced below 50 nm in some embodiments. In other cases, the nonplanarity may be no greater than about 25 nm, while in still other cases the nonplanarity may be no greater than about 10 nm. It is believed that the nonplanarity may be reduced by careful design and fabrication to a value below detection limits of a surface roughness characterization method, e.g., no greater than about 5 nm.

Figure 5:
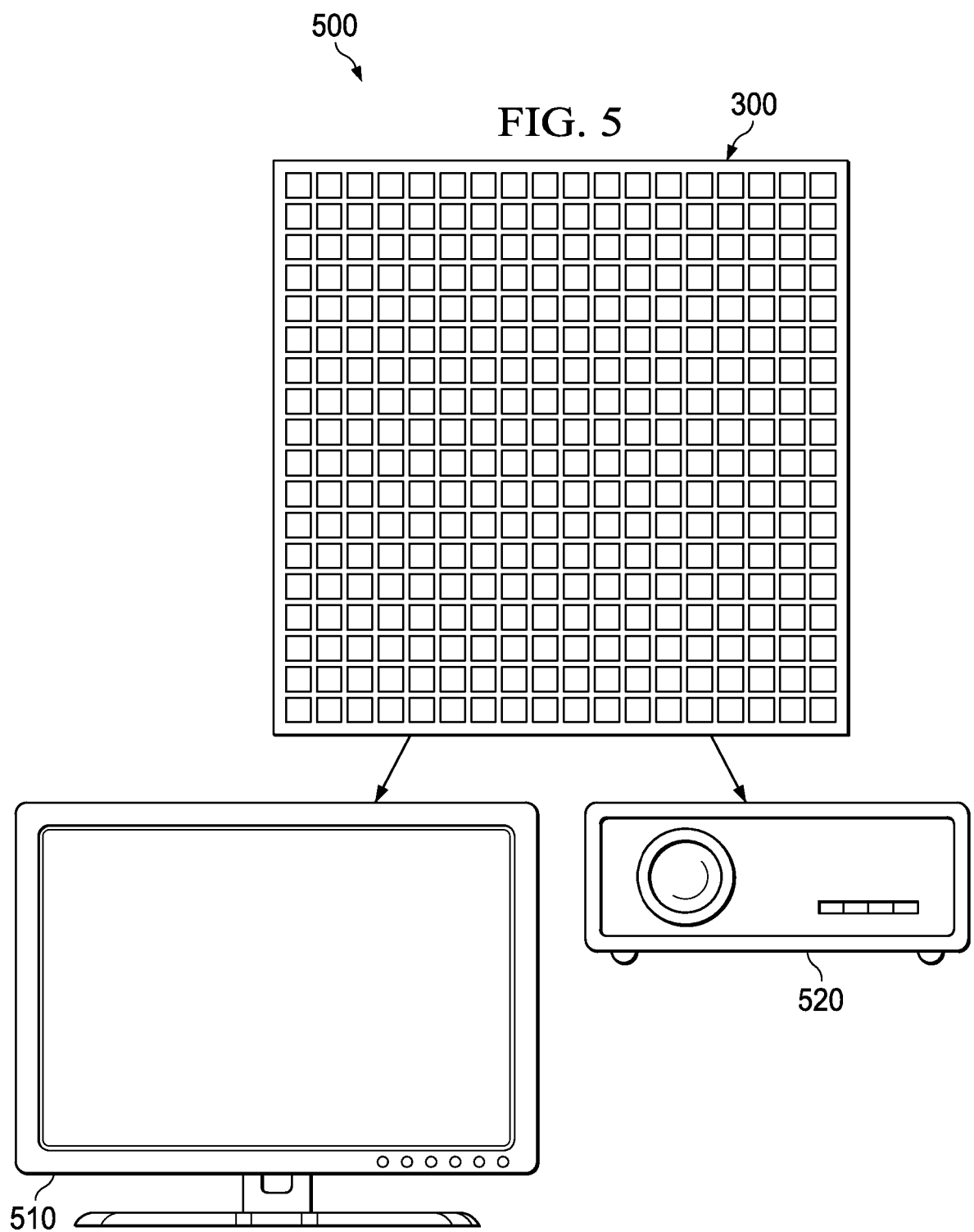
FIG. 5 illustrates electronic devices.

Turning finally to FIG. 5, illustrated is a system 500 including the DMD 300. The DMD 300 may be employed in, e.g., a television 510 or a projector 520. The image quality of the system 600 is expected to be improved relative to prior art systems due to the improved planarity of the pixel mirrors in the DMD 300. For example, the aforementioned improvement of contrast and brightness is expected to produce a similar improvement of contrast and brightness of the system 500.

Those skilled in the art to which the disclosure relates will appreciate that other and further additions, deletions, substitutions and modifications may be made to the described embodiments without departing from the scope of the disclosure.

What is claimed is:

1. A method of forming an electronic device, comprising:
providing a substrate having a patterned lower metal layer thereover and a first sacrificial layer located between said substrate and said lower metal layer;
forming a second sacrificial layer over said lower metal layer;
removing a portion of said second sacrificial layer including removing substantially all of said second sacrificial layer from an upper surface of said lower metal layer;
forming a third sacrificial layer over said second sacrificial layer;
forming an upper metal layer over said third sacrificial layer;
removing a portion of said upper metal layer; and
removing said first, second and third sacrificial layers.

2. The method as recited in claim 1, wherein removing a portion of said second sacrificial layer includes first forming a first opening in said second sacrificial layer over said lower metal layer.

3. The method as recited in claim 2, wherein removing said third sacrificial layer includes first forming a second opening in said third sacrificial layer over said lower metal layer in substantially a same location as said first opening.

4. The method as recited in claim 1, wherein said removing of said second sacrificial layer includes determining an etch endpoint by detecting a change of a plasma impedance.

5. The method as recited in claim 1, wherein said second sacrificial layer is a photoresist that reduces a step height of said first sacrificial layer by at least about 90%.

6. The method as recited in claim 1, wherein an upper surface of said third sacrificial layer has a mean height above said substrate that varies by about 50 nm or less across said substrate.

7. The method as recited in claim 1, wherein removing substantially all of said second sacrificial layer includes leaving a residue of said second sacrificial layer in a perimeter region of said lower metal layer.

8. The method as recited in claim 7, wherein said residue remains on said lower metal layer after said removing of said first, second and third sacrificial layers.

9. A method of forming an electronic device, comprising:
   providing a substrate having a patterned lower metal layer thereover and a first sacrificial layer located between said substrate and said lower metal layer;
   forming a second sacrificial layer over said lower metal layer;
   removing a portion of said second sacrificial layer including using a plasma etch process configured to have an etch nonuniformity of about 1% or better over said substrate.
   forming a third sacrificial layer over said second sacrificial layer;
   forming an upper metal layer over said third sacrificial layer;
   removing a portion of said upper metal layer; and
   removing said first, second and third sacrificial layers.

10. A method of forming an electronic device, comprising:
    providing a first sacrificial layer formed over a substrate, and a lower metal layer formed over the first sacrificial layer;
    removing portions of the lower metal layer in a lower metal layer patterning etch, leaving a reduced height part of the first sacrificial layer between remaining portions of the lower metal layer;
    forming a second sacrificial layer over the remaining portions of the lower metal layer including over the reduced height part of the first sacrificial layer;
    removing a portion of the second sacrificial layer in a blanket etch down to the lower metal layer, including removing substantially all of the second sacrificial layer from at least central regions of upper surfaces of the remaining portions of the lower metal layer;
    following the blanket etch, forming a third sacrificial layer over the second sacrificial layer, including over the upper surfaces of remaining portions of the lower metal layer;
    forming openings in the third sacrificial layer down to the central regions;
    forming an upper metal layer over the third sacrificial layer including within the openings;
    removing portions of the upper metal layer in an upper metal layer patterning etch; and
    removing remaining portions of the first, second and third sacrificial layers.

11. The method of claim 10, wherein a height difference between a peak of the second sacrificial layer formed over the remaining portions of the lower metal layer and a valley formed over the reduced height part of the first sacrificial layer is less than a step height between the reduced height part of the first sacrificial layer and a part of the first sacrificial layer left under remaining portions of the lower metal layer.

12. The method of claim 11, wherein the height difference is less than about 10% of the step height.

13. The method of claim 10, wherein the blanket etch further comprises stopping the blanket etch after detecting that the second sacrificial layer has been removed from the central regions of lower metal layer.

14. The method of claim 13, wherein the blanket etch is stopped after detecting a change of a plasma impedance.

15. The method of claim 14, wherein the change in plasma impedance is detected using a tuning network of a plasma tool.

16. The method of claim 14, wherein the change in plasma impedance may be detected using a signal taken from a servo unit controller that positions a matching network that moves to match a plasma impedance to minimize reflected power, or a position sensor.

17. The method of claim 10, further comprising, prior to the blanket etch, forming openings in the formed second sacrificial layer down to the upper surfaces of the remaining portions of the lower metal layer and removing portions of the second sacrificial layer within the openings.

18. The method of claim 17, wherein the first, second and third sacrificial layer each comprises photoresist material stabilized by baking with ultraviolet light;
    and wherein the openings are formed in the second sacrificial layer before baking.

19. The method of claim 10, wherein the first, second and third sacrificial layers comprise layers of photoresist or anti-reflective coating material.

20. The method of claim 10, wherein the second sacrificial layer is formed using a planarizing material.

21. The method of claim 20, wherein the second sacrificial layer is formed from a liquid solution of a photoresist or anti-reflective coating compound applied using a spin coating tool.

22. The method of claim 10, wherein the electronic device includes a reconfigurable pixel mirror assembly; and the lower metal layer is a hinge metal layer and the upper metal layer is a mirror metal layer of the reconfigurable pixel mirror assembly.

23. A method of forming an electronic device including a reconfigurable pixel mirror assembly, comprising:
    providing a first sacrificial layer formed over a substrate, and a hinge metal layer formed over the first sacrificial layer;
    removing portions of the hinge metal layer in a hinge metal layer patterning etch, leaving a reduced height part of the first sacrificial layer between remaining portions of the hinge metal layer;
    forming a second sacrificial layer over the remaining portions of the hinge metal layer including over the reduced height part of the first sacrificial layer;
    removing a portion of the second sacrificial layer in a blanket etch down to the hinge metal layer, including removing substantially all of the second sacrificial layer from at least central regions of upper surfaces of the remaining portions of the hinge metal layer; wherein the blanket etch is stopped after detecting a change of a plasma impedance;
    following the blanket etch, forming a third sacrificial layer over the second sacrificial layer, including over the upper surfaces of remaining portions of the hinge metal layer;
    forming openings in the third sacrificial layer down to the central regions;

forming a mirror metal layer over the third sacrificial layer including within the openings;

removing portions of the mirror metal layer in a mirror metal layer patterning etch; and removing remaining portions of the first, second and third sacrificial layers;

wherein a height difference between a peak of the second sacrificial layer formed over the remaining portions of the hinge metal layer and a valley formed over the reduced height part of the first sacrificial layer is less than a step height between the reduced height part of the first sacrificial layer and a part of the first sacrificial layer left under remaining portions of the hinge metal layer.

24. The method of claim 23, wherein the height difference is less than about 10% of the step height.

25. The method of claim 24, further comprising, prior to the blanket etch, forming openings in the formed second sacrificial layer down to the upper surfaces of the remaining portions of the hinge metal layer and removing portions of the second sacrificial layer within the openings.

* * * * *